(12) United States Patent
Nguyen et al.

(10) Patent No.: US 6,249,073 B1
(45) Date of Patent: Jun. 19, 2001

(54) DEVICE INCLUDING A MICROMECHANICAL RESONATOR HAVING AN OPERATING FREQUENCY AND METHOD OF EXTENDING SAME

(75) Inventors: Clark T. -C. Nguyen; Michael McCorquodale, both of Ann Arbor; Kun Wang, Madison Heights, all of MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 09/482,670

(22) Filed: Jan. 13, 2000

Related U.S. Application Data
(60) Provisional application No. 60/115,882, filed on Jan. 14, 1999.

(51) Int. Cl.[7] .................................................. H02N 1/00
(52) U.S. Cl. ............................................................. 310/309
(58) Field of Search ................................................ 310/309

(56) References Cited

U.S. PATENT DOCUMENTS

| | | | |
|---|---|---|---|
| 4,081,769 | 3/1978 | Shreve | 333/22 |
| 4,262,269 | 4/1981 | Griffin et al. | 333/204 |

(List continued on next page.)

OTHER PUBLICATIONS

Clark T. –C. Nguyen, et al., Design and Performance of CMOS Micromechanical Resonator Oscillators, IEEE International Frequency Control Symposium, Jan. 6, 1994.

Kun Wang, et al., Q–Enhancement of Microelectromechanical Filters Via Low–Velocity Spring Coupling, IEEE Ultrasonic Symposium, Aug. 1997.

John R. Clark, et al., Parallel–Resonator HF Micromechanical Bandpass Filters, IEEE International Conference on Solid–State Sensors and Actuators, Chicago, Jun. 16–19, 1997.

Frank D. Bannon, III, et al., High Frequency Microeletromechanical IF Filters, Dec. 1996, IEEE.

*Primary Examiner*—Thomas M. Dougherty
(74) *Attorney, Agent, or Firm*—Brooks & Kushman P.C.

(57) ABSTRACT

A flexural-mode, micromechanical resonator utilizing a non-intrusive support structure to achieve measured Q's as high as 8,400 at VHF frequencies from 30–90 MHz is manufactured using polysilicon surface micromachining technology. Also, a method for extending the operating frequency of the resonator as well as other types of micromechanical resonators is disclosed. One embodiment of the method is called a differential-signaling technique. The other embodiment of the method is called a dimple-down technique. The support structure includes one or more torsional-mode support springs in the form of beams that effectively isolate a resonator beam from its anchors via quarter-wavelength impedance transformations, minimizing anchor dissipation and allowing the resonator to achieve high Q with high stiffness in the VHF frequency range. The resonator also includes one or more spacers in the form of dimples formed on the flexural resonator beam or the substrate. In operation, the dimples determine a capacitive-transducer gap of the resonator. When a large DC-bias voltage is applied between a drive electrode and the resonator beam, the dimples provide a predetermined minimum distance between the flexural resonator beam and the drive electrode.

14 Claims, 4 Drawing Sheets

U.S. PATENT DOCUMENTS

| | | | |
|---|---|---|---|
| 4,596,969 | 6/1986 | Jachowski | 333/203 |
| 4,660,004 | 4/1987 | Jachowski | 333/134 |
| 4,721,925 | 1/1988 | Farace et al. | 333/154 |
| 4,724,351 | 2/1988 | EerNisse et al. | 310/328 |
| 4,862,122 | 8/1989 | Blair, Jr. et al. | 333/202 |
| 5,025,346 | 6/1991 | Tang et al. | 361/283 |
| 5,065,119 | 11/1991 | Jachowski | 333/202 |
| 5,090,254 | 2/1992 | Guckel et al. | 73/869.59 |
| 5,191,304 | 3/1993 | Jachowski | 333/202 |
| 5,399,232 | 3/1995 | Albrecht et al. | 156/633 |
| 5,428,325 | 6/1995 | Jachowski et al. | 333/203 |
| 5,446,729 | 8/1995 | Jachowski | 320/37 |
| 5,455,547 | 10/1995 | Lin et al. | 333/186 |
| 5,491,604 | 2/1996 | Nguyen et al. | 361/278 |
| 5,537,083 | 7/1996 | Lin et al. | 333/186 |
| 5,550,516 | 8/1996 | Burns et al. | 331/65 |
| 5,589,082 | 12/1996 | Lin et al. | 216/2 |
| 5,640,133 | 6/1997 | MacDonald et al. | 333/177 |
| 5,903,380 * | 5/1999 | Motamedi et al. | 359/225 |
| 6,094,289 * | 7/2000 | Moranski et al. | 359/223 |
| 6,142,358 * | 11/2000 | Cohn et al. | 228/44.7 |

* cited by examiner

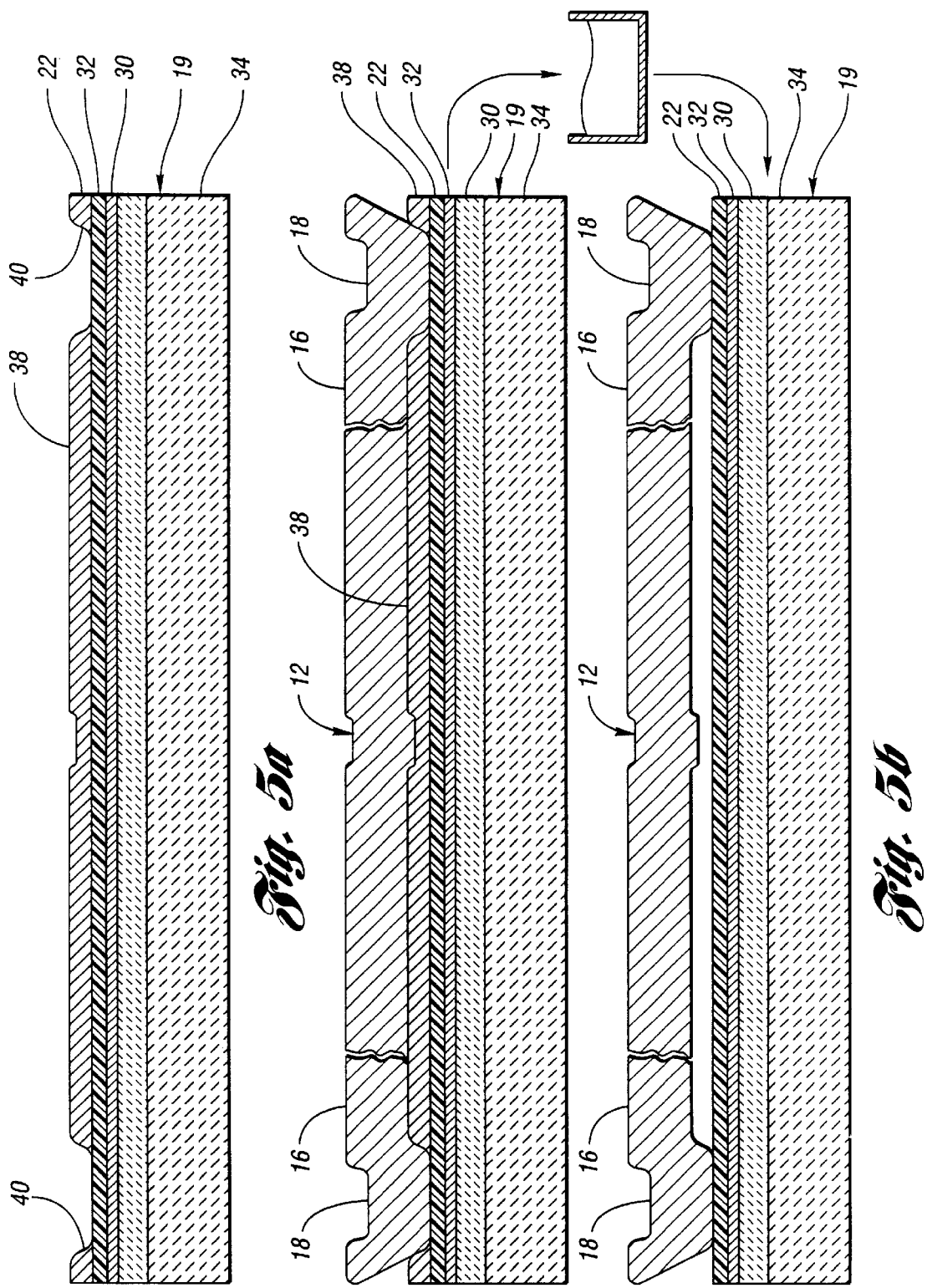

DEVICE INCLUDING A MICROMECHANICAL RESONATOR HAVING AN OPERATING FREQUENCY AND METHOD OF EXTENDING SAME

CROSS-REFERENCE TO RELATED APPLICATION

This application claims the benefit of U.S. provisional application entitled "VHF Free-Free Beam High-Q Micromechanical Resonators" filed Jan. 14, 1999 and having U.S. Ser. No. 60/115,882.

GOVERNMENT RIGHTS

This invention was made with government support under Contract No. F30602-97-2-0101 awarded by DARPA with portions supported by NSF and NASA/JPL. The government has certain rights in the invention.

1. Technical Field

This invention relates to devices including micromechanical resonators and, in particular, to devices including micromechanical resonators having operating frequencies and methods of extending the operating frequencies.

2. Background Art

Vibrating mechanical tank components, such as crystal and SAW resonators, are widely used in current wireless communication sub-systems for frequency selection and reference due to their high quality factor, Q, and extraordinary temperature stability. However, these devices are bulky, normally require precise machining, and, therefore, are expensive. Most importantly, being off-chip components, these mechanical devices must interface with integrated electronics at the board level, and this constitutes an important bottleneck to miniaturization and performance of heterodyning transceivers.

In recent years, micromechanical resonators (abbreviated "$\mu$resonators") with similar performance to their macro-counterparts have been demonstrated using IC-compatible, polysilicon surface-micromachining technology. With Q's of over 80,000 under vacuum and center frequency temperature coefficients in the range of −10 ppm/° C. (several times less with nulling techniques), polycrystalline silicon $\mu$resonators can serve well as miniaturized substitutes for crystals in a variety of high-Q oscillator and filtering applications. To date, high-Q, folded-beam $\mu$resonators in the frequency range from several to hundreds of kilohertz have been demonstrated. However, for communication applications, higher frequency resonators are required, such as IF filters in the VHF range.

Vibrating beam micromechanical (or "$\mu$mechanical") resonators constructed in a variety of materials, from polycrystalline silicon to plated-nickel, have recently emerged as potential candidates for use in a variety of frequency-selective communications applications. In particular, provided the needed VHF and UHF frequencies can be attained, both low loss IF and RF filters and high-Q oscillators stand to benefit from the tiny size, virtually zero DC power consumption, and integrability of such devices.

To date, due to the relative ease with which they attain both small mass and high stiffness, clamped-clamped beam $\mu$mechanical resonators have been intensively investigated for VHF range applications. The ability to simultaneously achieve high-Q and high stiffness is paramount for communications-grade resonators, since stiffness directly influences the dynamic range of circuits comprised of such resonators. However, for the case of clamped-clamped beam designs, larger stiffness often comes at the cost of increased anchor dissipation, and thus, lower resonator Q.

U.S. Pat. No. 5,640,133 to MacDonald et al. discloses a capacitance-based tunable micromechanical resonator. The resonator includes a movable beam which holds a plurality of electrodes. The resonator also includes a plurality of stationary electrodes. In operation, an adjustable bias voltage, applied to the beam electrodes and the stationary electrodes, is used to adjust the resonant frequency of the resonator.

U.S. Pat. No. 5,550,516 to Burns et al. discloses an integrated resonant microbeam sensor and transistor oscillator. The sensor and oscillator, capable of providing high-Q values, utilizes various circuitry, electrode placement, and various configurations of microbeam geometry to vary the operating resonant frequency.

U.S. Pat. No. 5,399,232 to Albrecht et al. discloses a microfabricated cantilever stylus with an integrated pyramidal tip. The pyramidal tip, integrally formed on the cantilever arm, limits the movement of the arm in the direction of the tip.

U.S. Pat. No. 4,262,269 to Griffin et al. discloses a Q-enhanced resonator which utilizes resonator positioning to provide a desired performance. Resonators are separated by one-quarter-wavelength distances to obtain desired loss characteristics.

U.S. Pat. No. 4,721,925 to Farace et al. discloses a micromechanical electronic oscillator etched from a silicon wafer. The patent discusses the configuration and the circuitry which enables the oscillator to perform according to desired characteristics.

The following U.S. patents are generally related to this invention: U.S. Pat. Nos. 4,081,769; 4,596,969; 4,660,004; 4,862,122; 5,065,119; 5,191,304; 5,446,729; 5,428,325; 5,025,346; 5,090,254; 5,455,547; 5,491,604; 5,537,083; and 5,589,082.

DISCLOSURE OF INVENTION

An object of the present invention is to provide a device including a micromechanical resonator having a high-Q factor formed on a substrate wherein the device has a frequency range of current commercial transceivers and to further provide a method for extending the operating frequency of the resonator.

Another object of the present invention is to provide a device including a micromechanical resonator having a high-Q factor formed on a substrate wherein the device retains the basic flexural-mode beam design of previous resonators, but strategically altering their supports so that anchors and their associated losses are virtually eliminated from the design; using this approach, free-free beam $\mu$mechanical resonators have been demonstrated with center frequencies from 30 MHz to 90 MHz and above, high stiffness, and Q's as high as 8,400.

Yet another object of the present invention is to provide device including a micromechanical resonator having a high-Q factor formed on a substrate wherein the device: a) is compatible with silicon-based planar IC technology; b) is reduced by orders of magnitude in size compared to SAW and quartz resonators; c) achieves high-Q in wide VHF range; d) has a yield-enhancing design; and (d) has good temperature stability. This deice has potential applications in wireless transceivers (e.g., cellular phones, cordless phones, GPS, etc.) and resonator-based sensors systems.

In carrying out the above objects and other objects of the present invention, a device including a micromechanical resonator having an operating frequency and a resonator beam formed on a substrate is provided. The device includes a non-intrusive support structure anchored to the substrate to support the resonator beam above the substrate. The support structure includes at least one torsional beam dimensioned to correspond to an effective quarter-wavelength of the operating frequency of the resonator. The at least one torsional beam is attached at at least one flexural nodal point of the resonator beam so that the resonator beam sees substantially no resistance to transverse motion. The resonator is a high-Q resonator.

In an embodiment of the present invention, at least one drive electrode is formed on the substrate to allow electrostatic excitation of the resonator beam. The resonator beam and the at least one drive electrode define a capacitive transducer gap therebetween.

At least one spacer having a height extends between the resonator beam and the substrate at the at least one flexural nodal point. The size of the gap is based on the height of the at least one spacer during pull down of the resonator beam.

Preferably, the resonator is a silicon-based resonator, but the resonator may also be nickel or diamond-based.

Further in carrying out the above objects and other objects of the present invention, a high-Q flexural mode micromechanical resonator device is provided. The device includes a substrate and a resonator beam having at least one flexural nodal point. The device also includes at least one torsional beam for supporting the resonator beam at the at least one flexural nodal point and at least one rigid anchor for anchoring the at least one torsional beam to the substrate. The device further includes at least one drive electrode to cause the resonator beam to oscillate upon application of an electrical signal to the at least one drive electrode. The at least one torsional beam is dimensioned so as to effect an impedance transformation that substantially isolates the oscillating resonator beam from the at least one rigid anchor.

Still further in carrying out the above objects and other objects of the present invention, a method for extending the operating frequency of a micromechanical resonator is provided. The micromechanical resonator includes a resonator beam having a fundamental resonant mode formed on a substrate. The method includes the step of forcing different portions of the resonator beam to move in opposite directions at the same time so that the resonator beam vibrates in a resonant mode, m, higher than the fundamental resonant mode. The resonator beam has m+1 nodal points of flexural deflection.

In a first embodiment of the method, the micromechanical resonator includes a plurality of drive electrodes spaced along the resonator beam to allow electrostatic excitation of the resonator beam. The step of forcing includes the steps of applying an in-phase signal to one of the drive electrodes to deflect a first portion of the resonator beam in a first direction and applying an out-of-phase signal to the other drive electrode to deflect a second portion of the resonator beam in a second direction opposite the first direction to force the resonator beam into a correct mode shape.

The micromechanical resonator may include m+1 torsional beams dimensioned to correspond to an effective quarter wavelength of the operating frequency. One of the torsional beams is attached at each of the nodal points of the resonator beam so that the resonator beam sees substantially no resistance to transverse or torsional motion.

In a second embodiment of the method, the micromechanical resonator includes a drive electrode formed on the substrate to allow electrostatic excitation of the resonator beam. The step of forcing includes the step of applying a signal to the drive electrode. The resonator beam and the drive electrode define a capacitive transducer gap therebetween. The micromechanical resonator further includes m+1 spacers having a height and which extend between the resonator beam and the substrate at the m+1 nodal points. The m+1 spacers force the resonator beam into a correct mode shape during the application of the signal to the drive electrode.

In the second embodiment, the micromechanical resonator typically includes a sense electrode also formed on the substrate to sense output current.

The micromechanical resonator may include less than m+1 of the torsional beams in the second embodiment of the method. For example, the micromechanical resonator may include a single torsional beam.

The above objects and other objects, features, and advantages of the present invention are readily apparent from the following detailed description of the best mode for carrying out the invention when taken in connection with the accompanying drawings.

BRIEF DESCRIPTION OF DRAWINGS

FIG. 5a is a sectional view of a torsional beam of the resonator during its fabrication taken along lines 5—5 of FIG. 1;

FIG. 5b are views similar to the view of FIG. 5a further along in the fabrication process;

BEST MODE FOR CARRYING OUT THE INVENTION

Figure 1:
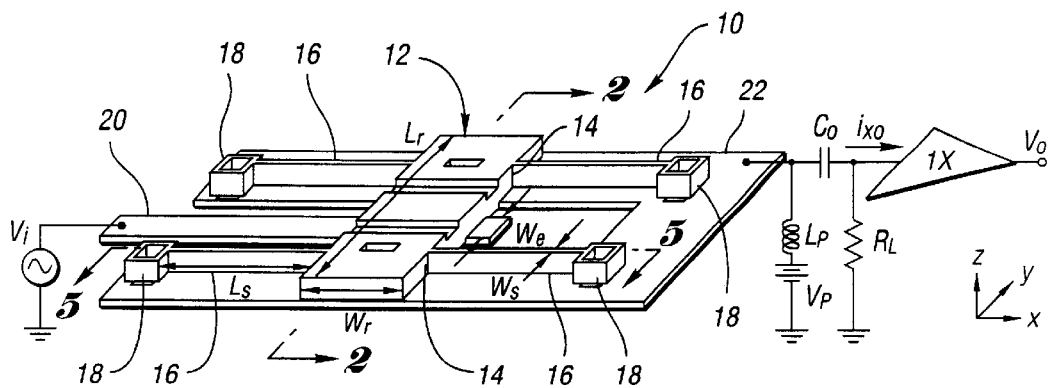
FIG. 1 is a schematic perspective view of free-free beam resonator with a non-intrusive support structure of the present invention and illustrating typical bias, excitation, and off-chip output sensing circuits.

Referring now to the drawing Figures, there is illustrated in FIG. 1 a perspective view schematic of a free-free beam, flexural-mode, μmechanical device or resonator, generally indicated at 10, and an electrical pick off scheme. It is to be understood, however, that the 1X buffer will not be used in most practical applications.

As shown in FIG. 1, the device 10 includes a free-free μmechanical flexural beam, generally indicated at 12, supported at its flexural nodal points 14 by four torsional beams 16, each of which is anchored to a substrate, generally indicated at 19, by rigid contact anchors 18, as best shown in FIGS. 5a–5b. The substrate 19 preferably includes a number of layers as hereinafter described. It is to be understood, however, that a single torsional beam may be utilized with a single rigid contact anchor without departing from the present invention. In this case, the single torsional beam would support the flexural beam at a single flexural nodal point.

A drive electrode 20 is provided underneath the free-free beam 12 to allow electrostatic excitation via an applied AC voltage $V_i$, and output currents are detected directly off a DC-biased (via $V_P$) resonator structure 22. The torsional support beams 16 for this device 10 are strategically designed with quarter-wavelength dimensions, so as to effect an impedance transformation that isolates the free-free beam 12 from the rigid anchors 18. Ideally, the free-free beam 12 sees zero-impedance into its supports or beams 16, and thus, effectively operates as if levitated without any supports. As a result, anchor dissipation mechanisms normally found in previous clamped-clamped beam resonators are greatly suppressed, allowing much higher device Q. It is to be understood, however, that multiple drive electrodes may be utilized for push-pull excitation. In this case, one can also use the electrodes for sensing, frequency tuning and detection of the output.

Figure 2A:
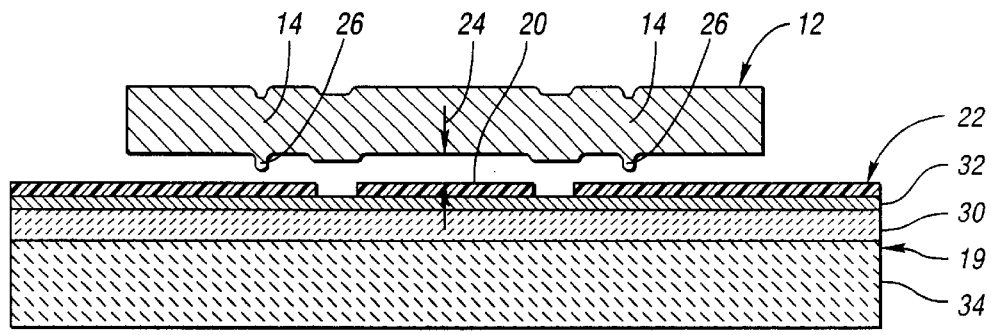
FIG. 2a is a sectional view of the resonator taken along lines 2—2 of FIG. 1 after fabrication.

As an additional yield- and Q-enhancing feature, the transducer capacitor gap spacing in this device is not entirely determined via a thin sacrificial oxide, as was done (with difficulty) in previous clamped-clamped beam high frequency devices. Rather, a capacitor gap 24 is now determined by the height of spacers or dimples 26, set via a timed etch. As shown in FIG. 2, the height of the dimples 26 is such that when a sufficiently large DC-bias $V_P$ is applied between the drive electrode 20 and the resonator beam 12, the whole structure comes down and rests upon the dimples 26, which are located at the flexural nodal points 14, and thus, have little impact on resonator operation. The spacers 26 may be formed either on the resonator beam 12 or on the substrate 19.

The advantages of using dimples to set the capacitor gap spacings 24 are two-fold: (1) much thicker sacrificial oxide spacers can be used, alleviating previous problems due to pinholes and non-uniformity in ultra-thin sacrificial layers; and (2) the thicker sacrificial oxide is easier to remove than previous thinner ones, and thus, decreases the required HF release etch time (as illustrated in FIG. 5b) and lessens the chance that etch by-products remain in the gap 24 (where they might interfere with resonator operation and Q). It is to be understood, however, that a single spacer or dimple may be utilized as well as more than two spacers. Typically, multiple spacers or dimples would be used for higher mode operation of the device as described in greater detail hereinbelow.

Free-Free Beam μResonator Design

Proper design of the free-free beam μmechanical resonator device 10 of the present invention entails not only the selection of geometries that yield a given frequency, but also geometries that ensure support isolation, that guarantee dimple-down and pull-in stability, and that suppress spurious modes associated with the more complicated support network. Each of these topics is now addressed.

Resonator Beam Design

For most practical designs, the resonator beam width $W_r$ is dictated by transducer and length-to-width ratio design considerations, while its thickness h is determined primarily by process constraints. Almost by default, then, the length $L_r$ becomes the main variable with which to set the overall resonance frequency. For the case of large $L_r$-to-$W_r$ and $L_r$-to-h ratios, the popular Euler-Bernoulli equation for the fundamental mode frequency of a free-free beam suffices, given by:

$$f_o = \frac{1}{2\pi}\alpha\sqrt{\frac{k_{ri}}{m_{ri}}} = \frac{1}{2\pi}\alpha\sqrt{\frac{k_{mi}}{m_{ri}}}\left(1 - \left(\frac{k_e}{k_m}\right)\right)^{1/2} \quad (1)$$

where $k_{ri}$ and $m_{ri}$ are the effective stiffness and mass, respectively, at the midpoint of the μresonator beam 12; α is a fitting parameter that accounts for beam topography and finite elasticity in the anchors 18; $k_{mi}$ is the mechanical stiffness of the μresonator, again, at the midpoint of the beam 12, but this time for the special case when $V_P=0V$ and given by:

$$k_{mi} = \left[1.03\sqrt{\frac{E}{\rho}}\frac{h}{L_r^2}\right]^2 m_{ri}; \quad (2)$$

and $<k_e/k_m>$ is a parameter representing the combined mechanical-to-electrical stiffness ratios integrated over the electrode width $W_e$, and satisfying the relation:

$$\left\langle\frac{k_e}{k_m}\right\rangle = \int_{\frac{1}{2}(L_r-W_e)}^{\frac{1}{2}(L_r+W_e)} \frac{V_P^2 \varepsilon_o W_r}{d^3 k_m(y')} dy' \quad (3)$$

where $\varepsilon_o$ is the permitivity in vacuum, d is the electrode-to-resonator gap spacing with dimples down. All other geometric variables are given in FIG. 1, and the location dependence of the mechanical stiffness $k_m$ is now shown explicitly.

Equation (1) constitutes a convenient closed form relation that works well for low frequency designs, where beam lengths are much larger than their corresponding widths and thicknesses. For upper VHF designs, for which beam lengths begin to approach their width and thickness dimensions, the Euler-Bernoulli equation is no longer accurate, since it ignores shear displacements and rotary inertias. To obtain accurate beam lengths for upper VHF μmechanical resonators, the design procedure by Timoshenko is more appropriate, involving the simultaneous solution of the coupled equations:

$$\frac{d}{dy}\left(EI_r\frac{d\Psi}{dy}\right) + \kappa AG\left(\frac{dz}{dy}\Psi\right) - J_r\frac{d^2\Psi}{dt^2} = 0 \quad (4)$$

$$m\frac{d^2z}{dt^2} - \frac{d}{dy}\left[\kappa AG\left(\frac{dz}{dy}\Psi\right)\right] - p(y,t) = 0 \quad (5)$$

where $$I_r = \frac{W_r h^3}{12}, \ G = \frac{E}{2(1+v)}, \text{ and } J_r = hW_r\frac{(h^2 + W_r^2)}{12}, \quad (6)$$

and where $I_r$ is the moment of inertia, E is the Young's modulus of the structural material, $v$ is Poisson's ratio, $\kappa$ is a shape factor (for a rectangular cross section, $\kappa$ is 2/3), A, m, and p(y,t) are the cross-sectional area, mass per unit length, and loading per unit length, respectively, of the beam, $\Psi$ is the slope due to bending, and axis definitions are provided in FIG. 1.

Support Structure Design

Figure 3:
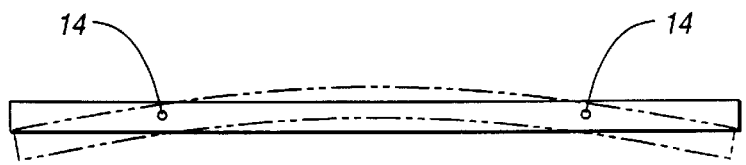
FIG. 3 is a side elevational view illustrating a free-free beam in its static state with a pair of nodal points and vibrating in its fundamental mode by phantom lines.

As discussed above, the subject free-free $\mu$mechanical resonator device 10 is supported by four torsional beams 16 attached at its fundamental-mode node points 14, identified in FIG. 3 and specified via evaluation of the mode shape equation:

$$Z_{mode}(y) = \cos h\beta y + \cos \beta y - \zeta[\sin \beta y + \sin \beta y], \quad (7)$$

where $$\zeta = \frac{\cosh\beta L_r - \cos\beta L_r}{\sinh\beta L_r - \sin\beta L_r} \text{ and } \beta^2 = \frac{\rho A}{EI_r}\omega_o^2, \quad (8)$$

and where $\omega_0$ is the radian resonance frequency, and $\rho$ is the density of the structural material. For the fundamental mode, $\beta L_r$ is 4.73.

Because the beams 16 are attached at the node points 14, the support springs or beams 16 (ideally) sustain no translational movement during resonator vibration, and thus, support (i.e., anchor) losses due to translational movements—such as those sustained by clamped-clamped beam resonators—are greatly alleviated. Furthermore, with the recognition that the supporting torsional beams 16 actually behave like acoustic transmission lines at the VHF frequencies of interest, torsional loss mechanisms can also be negated by strategically choosing support dimensions so that they present virtually no impedance to the free-free beam 12. In particular, by choosing the dimensions of a torsional support beam 16 such that they correspond to an effective quarter-wavelength of the resonator operating frequency, the solid anchor condition on one side of the support beam 16 is transformed to a free end condition on the other side, which connects to the resonator beam 12. As a result, the resonator beam 12 effectively "sees" no supports at all and operates as if levitated above the substrate 19, devoid of anchors and their associated loss mechanisms.

Figure 4A:
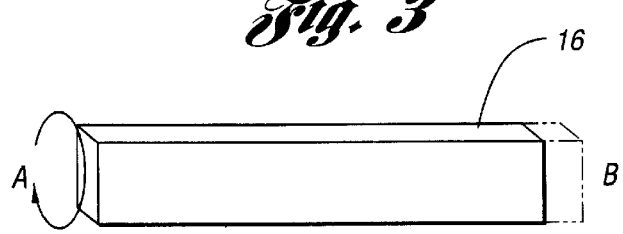
FIG. 4a is a schematic perspective view of a quarter-wavelength torsional beam of the resonator with side anchoring.
Figure 4B:
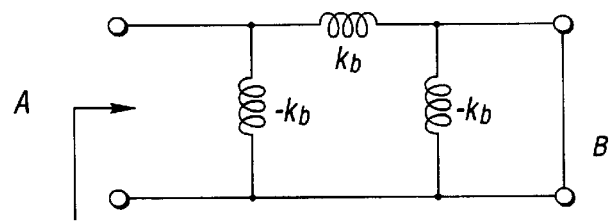
FIG. 4b is a circuit schematic of an acoustic network equivalent to the beam of FIG. 4a showing zero impedance at port A with port B grounded.
Figure 6:
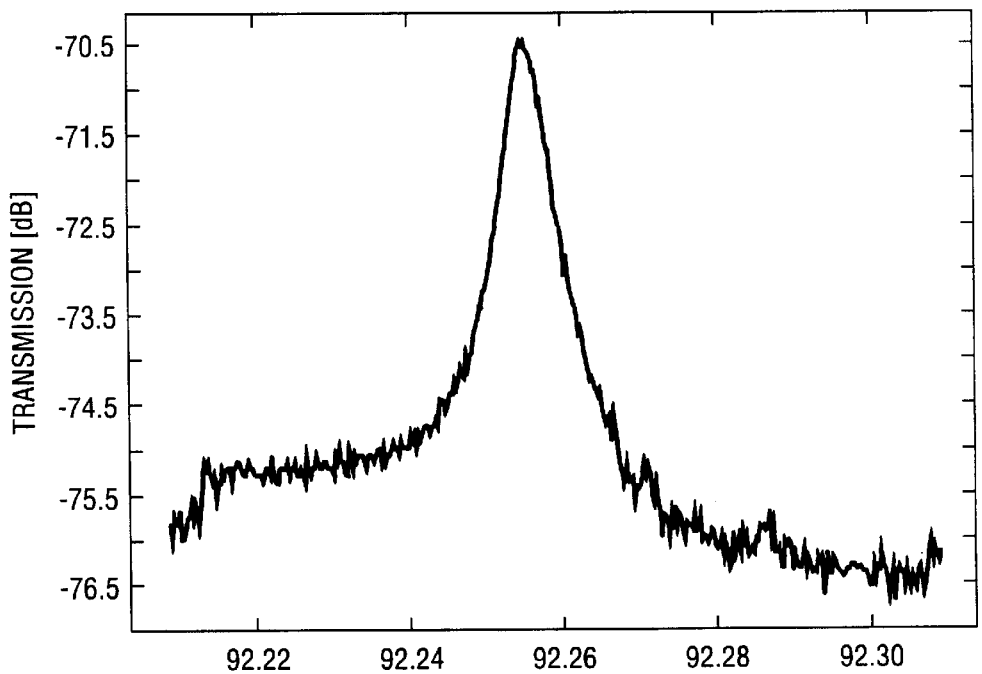
FIG. 6 is a graph of measured spectra for a 92.25 MHz free-free beam resonator of the present invention.

The above transformation is perhaps more readily seen using the equivalent acoustic $\pi$ network model for a torsional beam 16. In particular, when the dimensions of a given support beam 16 correspond to an effective quarter-wavelength of the resonator operation frequency, its equivalent acoustic $\pi$ network takes the form shown in FIG. 4b, where series and shunt arm impedances are modeled by equal and opposite stiffnesses, $k_b$ and $-k_b$. Given that anchoring the beam 16 of FIG. 4a at side B corresponds to shorting the B port of FIG. 4b, it is clear by cancellation of the remaining $k_b$ and $-k_b$ in the circuit of FIG. 4b that the impedance seen at port A will be zero.

Through appropriate acoustical network analysis, the dimensions of a torsional beam are found to correspond to a quarter-wavelength of the operating frequency when they satisfy the expression:

$$L_s = \frac{1}{4f_o}\sqrt{\frac{G\gamma}{\rho J_s}}, \quad (9)$$

where the subscript s denotes a support beam, $$J_s = hW_s\left(\frac{h^2 + W_s^2}{12}\right),$$

and $\gamma$ is the torsional constant.

Transducer Design

The value of the series motional resistance $R_z$ (among other impedance elements) seen looking into the input or drive electrode 20 of the $\mu$mechanical resonator 10 is of utmost importance in both filtering and oscillator applications. As with previous capacitively transduced clamped-clamped beam $\mu$mechanical resonators, parameters such as $W_e$, $W_r$, and d, that directly influence the electrode-to-resonator overlap capacitance have a direct bearing on the electrical impedance seen looking into the input electrode 20, as does the DC-bias $V_P$ applied to the resonator 10. By appropriate impedance analysis, the expression governing $R_z$ for this capacitively transduced free-free beam $\mu$mechanical resonator 10 takes on the form:

$$R_z = \frac{V_i}{I_z} = \left[\int_{L_1}^{L_2}\int_{L_1}^{L_2}\frac{\omega_o Q V_P^2(\varepsilon_o W_r)^2}{d^4 k_m(y')}\frac{Z_{mode}(y)}{Z_{mode}(y')}dy'dy\right]^{-1}, \quad (10)$$

where $L_1 = 0.5(L_r - W_e)$ and $L_2 = 0.5(L_r + W_e)$ for a centered electrode 20.

As discussed above, under normal operation the free-free beam resonator 10 should be pulled down onto its supporting dimples 26 via a DC-bias voltage $V_P$ applied to the resonator 10. Only when the dimples 26 are "down" is the electrode-to-resonator gap spacing d small enough to provide adequate electromechanical coupling for most applications. Thus, when designing the device input electrode 20, careful consideration must be given to not only the input impedance seen when looking into the electrode 20, but also to the $V_P$ required to pull the dimples 26 down. This $V_P$ voltage should be sufficient to pull the resonator beam 12 down onto its dimples 26, yet small enough to avoid pull-down of the free-free beam 12 into the electrode 20 after the dimples 26 are down. Symbolically, the DC-bias voltage $V_P$ must satisfy the relation:

$$V_c > V_P > V_d, \quad (11)$$

where $V_d$ is the dimple-down voltage, and $V_c$ is the resonator pull-down voltage.

Figure 2B:
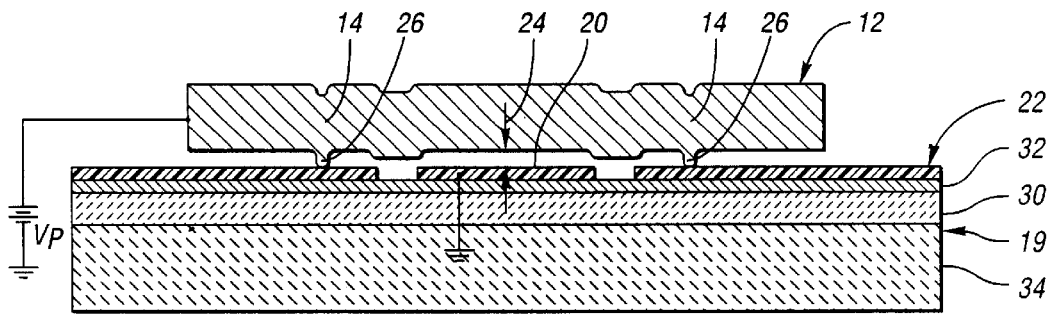
FIG. 2b is a view similar to the view of FIG. 2a but after the application of an appropriately sized DC-bias voltage $V_P$.

When pulling the resonator 10 down onto its dimples 26, because the supporting beams 16 are often much more compliant than the free-free resonator beam 12, very little bending occurs in the resonator beam 12 itself. Thus, the restoring force inhibiting pull-down is uniform over the electrode 20, and the expression for the dimple-down voltage $V_d$ takes on the form:

$$V_d = \sqrt{\frac{8}{27} \frac{k_s d_{ini}^3}{\varepsilon_o W_r W_e}}, \text{ where } k_s = EW_s\left(\frac{h}{L_s}\right)^3 \quad (12)$$

where $k_s$ is the stiffness of supporting beams 16, and $d_{ini}$ is the initial gap (i.e., FIG. 2a) before the beam 12 is brought down to its dimples 26 (i.e., FIG. 2b).

Once the dimples 26 are down, further movement of the resonator beam 12 toward the electrode 20 is attained via bending of the resonator beam 12 itself. The electrode 20 now sees a distributed stiffness inhibiting pull-down, which now must be integrated over the electrode area to accurately predict the catastrophic resonator pull-down voltage $V_c$. The procedure for determining $V_c$ then amounts to setting (3) equal to 1 and solving for the $V_P$ variable.

Fabrication of the Device

Several free-free beam μresonators with frequencies from 30–90 MHz and with varying initial gaps and dimple depths were designed using the methods detailed in the above section, then fabricated using a five-mask, polysilicon, surface-micromachining technology described by the process flow shown in FIGS. 5a and 5b. Table I summarizes design data for a 70 MHz version, with reference to the parameters and dimensions indicated in FIG. 1:

TABLE I

Euler & Timoshenko Design Comparison

| Parameter | Euler Beam | Timoshenko Beam | Unit |
|---|---|---|---|
| Designed Frequency, $f_o$ | 70 | 70 | MHz |
| Measured Frequency, $f_o$ | 66.62 | 70.94 | MHz |
| Resonator Beam Length, $L_r$ | 15.4 | 14.9 | μm |
| Resonator Beam Width, $W_r$ | 6 | 6 | μm |
| Supporting Beam Length, $L_s$ | 13.4 | 13.3 | μm |
| Supporting Beam Width, $W_s$ | 1 | 1 | μm |
| Resonator Stiffness, $k_{ri}$ | 55,638 | 53,901 | N/m |
| Resonator Mass, $m_{ri}$ | $2.88 \times 10^{-13}$ | $2.79 \times 10^{-13}$ | kg |
| Initial Gap, $d_{ini}$ | 1,500 | 1,500 | Å |
| Dimple Height, d | 1,000 | 1,000 | Å |
| Dimple-Down Voltage, $V_d$ | 98 | 98 | V |
| Catastrophic Pull-In Voltage, $V_C$ | 255.9 | 268.9 | V |
| Young's Modulus, E | 150 | 150 | GPa |
| Poisson Ratio, v | 0.29 | 0.29 | — |

The fabrication sequence begins with isolation layers 30 and 32 formed via successive growth and deposition of 2 μm thermal oxide and 2000 Å LPCVD $Si_3N_4$, respectively, over a <100> lightly-doped p-type starting silicon wafer 34. Next, 3000 Å of LPCVD polysilicon is deposited at 585° C. and phosphorous-doped via implantation, then patterned to form the ground planes 22 and interconnects. An LPCVD sacrificial oxide layer 38 is then deposited to a thickness dictated by Equation (12), after which successive masking steps are used to achieve dimples and anchor openings 40 (c.f., FIG. 5a). To ensure accurate depths, dimples are defined via a precisely controlled reactive-ion etch using a $CF_4$ chemistry. Anchors 18, on the other hand, are simply wet-etched in a solution of buffered hydrofluoric acid (BHF).

Next, the structural polysilicon is deposited via LPCVD at 585° C., and phosphorous dopants are introduced via ion-implantation. A 2000 Å-thick oxide mask is then deposited via LPCVD at 900° C., after which the wafers are annealed for one hour at 1000° C. to relieve stress and distribute dopants. Both the oxide mask and structural layer are then patterned via $SF_6/O_2$- and $Cl_2$-based RIE etches, respectively, and the structures 12 and 16 are then released via a 5 minute etch in 48.8 wt. % HF. This release etch time is significantly shorter than that required for previous clamped-clamped beam resonators (~1 hr) that did not benefit from dimple-activated gap spacings, and so required sacrificial oxide thicknesses on the order of hundreds of Angstroms.

After structural release, aluminum is evaporated and patterned over polysilicon interconnects via lift-off to reduce series resistance.

Experimental Data

Experimental data strongly suggests that anchor dissipation becomes a dominant loss mechanism for clamped-clamped beam resonators with high stiffness at VHF frequencies, and that the use of the free-free beam resonator 10 with the non-intrusive supports 16 can greatly alleviate this loss mechanism.

Experimental data also shows that clamped-clamped beam resonators exhibit a lowering in Q as frequencies increase from 50–70 MHz, whereas their free-free beam counterparts maintain a fairly constant Q over this range.

First Conclusion

Using a combination of quarter-wavelength torsional supports 16 attached at node points 14 and electrically activated, dimple-determined electrode-to-resonator gaps 24, the free-free beam μmechanical resonator design disclosed herein adeptly removes the anchor dissipation and processing problems that presently hinder their clamped-clamped beam counterparts, and, in doing so, successfully extends the application range of high-Q microelectromechanical systems to the mid-VHF range, with plenty of Q to spare en route to even high frequencies. The present μmechanical resonator design achieves Q's exceeding 8,000 in a frequency range that includes some of the most popular IF's used in many cellular and cordless communication subsystems, and does so while retaining the high stiffness needed to maintain adequate dynamic range in both oscillator and filtering applications.

The VHF frequencies described herein by no means represent the ultimate range of μmechanical resonator technology, especially given that the observed Q of this design seems to maintain its high value throughout the designed range of frequencies, showing little or no roll-off with increasing frequency.

Methods for extending the frequency of the free-free beam μmechanical resonator design previously described are now addressed. Specifically, two techniques can be employed to excite higher modes of vibration in order to realize gains in frequency. These techniques are not limited to the free-free beam design. They, in fact, can be applied to a variety of other resonator designs.

As previously mentioned, the free-free beam μmechanical resonator may operate by vibrating in its fundamental mode as shown in FIG. 3.

It is difficult to extend the frequency of the free-free beam resonator that operates in the fundamental mode due to the need for significant decreases in geometry. However, appreciable gains in frequency can be attained without any decrease in geometric size by exciting higher resonant modes of the resonator beam as shown in FIGS. 7a and 7b.

Figure 7A:
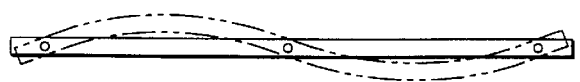
FIG. 7a is a view similar to FIG. 3 with a beam having three nodal points and vibrating in its second resonant mode as illustrated by phantom lines.
Figure 7B:
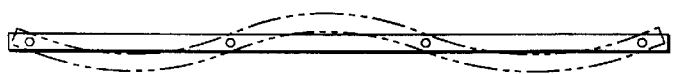
FIG. 7b is a view similar to FIGS. 3 and 7a with a beam having four nodal points and vibrating in its third resonant mode as illustrated by phantom lines.

In FIGS. 7a and 7b, conceptual depictions of second and third mode excitation are presented, respectively. Clearly for each mode, m, there exist m+1 nodal points of flexural deflection. The frequency gain factor attained by these modes and subsequent modes for a fixed geometry are shown in Table 2. Here, the frequency gains for a 100 MHz fundamental mode device are also presented.

TABLE II

Frequency Gain as a Function of Mode Number

| Mode | Nodal Points | $f_n/f_1$ | $f_1$(MHz) |
| --- | --- | --- | --- |
| 1 | 2 | 1.000 | 100 |
| 2 | 3 | 4.730 | 473 |
| 3 | 4 | 7.853 | 785 |
| 4 | 5 | 10.996 | 1100 |
| 5 | 6 | 14.137 | 1414 |

Figure 8:
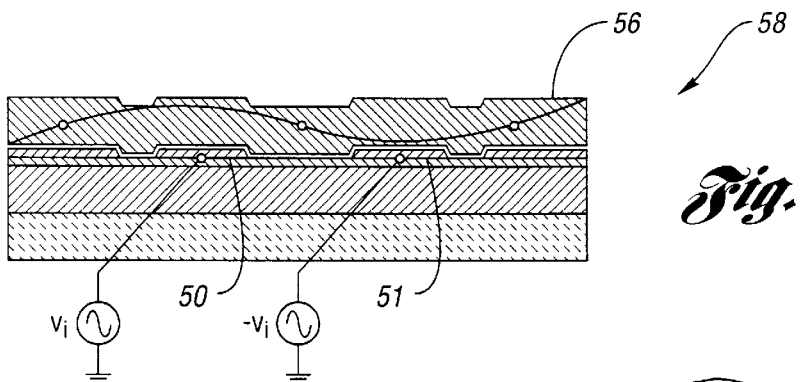
FIG. 8 is a sectional view of the resonator and illustrating a differential signaling method for exciting the resonator in its second resonant mode.

One technique for exciting these higher modes is the use of differential signaling. As shown in FIG. 8, an in-phase signal is applied to an electrode 50 that induces beam deflection in one direction, while an out-of-phase signal is applied to an electrode 51 that induces beam deflection in the opposite direction as dictated by the mode shape. Although FIG. 8 only illustrates this technique for second mode excitation, it is extended readily to any mode of vibration greater than the fundamental mode.

Figure 9:
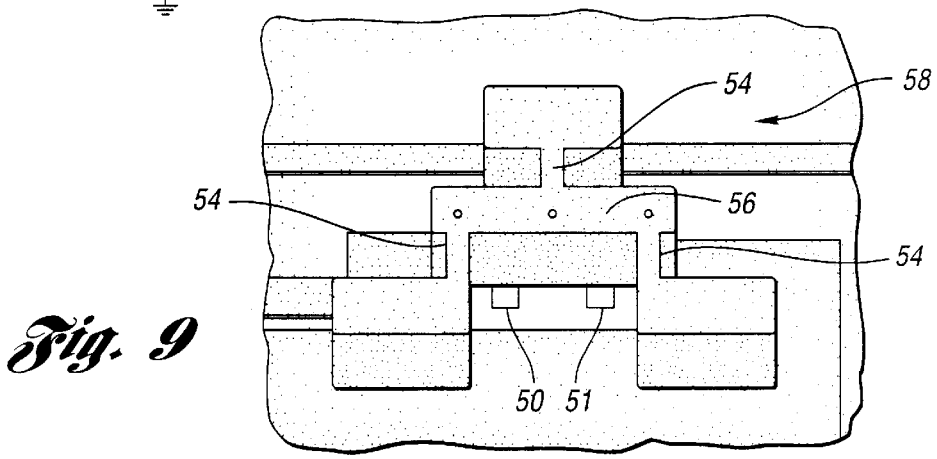
FIG. 9 is a top perspective view of a second mode resonator having a support beam positioned at each nodal point and a pair of electrodes.

In order to guarantee that the correct mode shape is forced, at least one quarter-wavelength support beam 54 is placed at each nodal point, as illustrated in FIG. 9. The quarter-wavelength support beams 54 are designed to present zero torsional mode impedance to their flexural beam 56. However, the support beams 54 present significant flexural mode impedance. Therefore, the beam 56 cannot deflect into any other mode shape. FIG. 9 presents an overhead schematic view of a second mode device, generally indicated at 58, with this topology.

Figure 10:
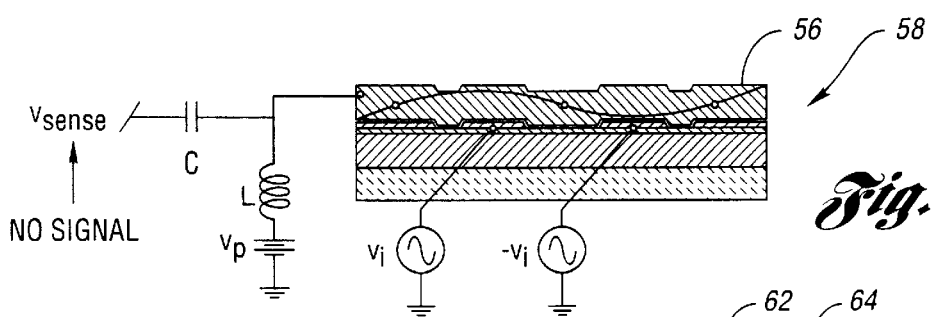
FIG. 10 is a sectional view of a resonator and sensing circuitry for sensing vibrations of the second resonant mode off the beam of the resonator.

One drawback of the differential-signaling technique is the difficulty in sensing the vibration of even-order resonant modes. This concept is illustrated best in FIG. 10. Since both electrodes 50 and 51 are used to force the beam 56 into the correct mode shape, the signal is most conveniently detected off of the beam 56 as shown in FIG. 10, where a capacitor C couples the signal off of the beam 56 and an inductor L isolates a bias voltage, $V_P$. However, no signal exits the beam 56 for even-order resonant modes. This is due to the nature of the mode shape for these modes, which effectively cancels any signal on the beam 56 by virtue of an antimetric shape. The same is not true of odd-order modes, which have a symmetric mode shape and therefore the differential signaling technique is suited well to these modes.

Another technique can be used in order to overcome the problems described above. Specifically, small dimples or spacers 60 are fabricated onto a beam 62 at each of the nodal points for a given mode shape. When the bias voltage ($V_P$) is applied, the beam 62 will rest on these dimples 60. The dimples 60 create "soft nodes" that force the beam 62 into the correct mode shape. The concept is substantially identical to playing a natural harmonic on a guitar. This approach is termed the "dimple-down technique" and is illustrated with the device 64 in FIG. 11.

Figure 11:
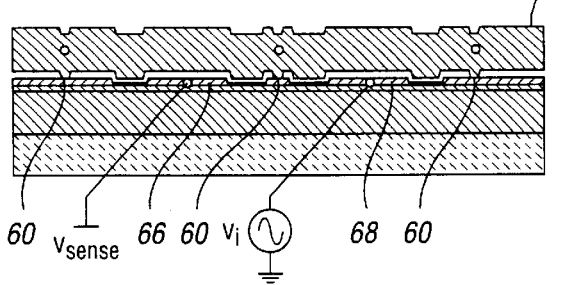
FIG. 11 is a sectional view of a resonator and sensing circuitry for sensing vibrations of the second resonant mode utilizing a dimple-down technique wherein one electrode is used to drive the device and another electrode is used for sensing the vibration.

Sensing the vibration is achieved easily for all resonant modes since it is no longer required to use both electrodes 66 and 68 in order to force the correct mode shape. Here the dimples 60 force the beam 62 into the mode shape, not the signals that are applied. As shown in FIG. 11, one electrode 68 can be used to drive the device 64 while the other electrode 66 can be used for sensing.

The dimple-down technique also permits the use of fewer quarter-wavelength support beams (not shown) since the mode shape is forced by the dimples 60 alone. In fact, as few as one support beam for the device 64 can be used.

Due to finite fabrication tolerance, quarter-wavelength beams can exhibit finite energy dissipation which reduces the resonator quality factor. Therefore, minimizing this dissipation mechanism is of paramount importance. The use of the described dimple-down technique and a single support beam (as opposed to multiple supports) minimizes this dissipation mechanism, and therefore offers better performance than the previously described differential-signaling technique.

Second Conclusion

Two techniques or methods for frequency extension by higher-mode operation of the free-free beam μmechanical resonator as well as other resonators have been presented. The differential-signaling technique is most appropriate for odd order modes while the dimple-down technique is suitable for any mode shape. However, considering performance, the dimple-down technique is superior since fewer quarter-wavelength support beams are required and therefore energy dissipation is minimized.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A micromechanical resonator device having an operating frequency, a resonator formed on a substrate and a support structure anchored to the substrate to support the resonator above the substrate characterized in that:

the support structure is attached at at least one nodal point of the resonator and the support structure and the resonator are both dimensioned so that the resonator is isolated during resonator vibration wherein energy losses to the substrate are substantially eliminated and wherein the resonator device is a high-Q resonator device.

2. The device as claimed in claim 1 wherein the support structure includes at least one beam attached to a nodal point of the resonator.

3. The device as claimed in claim 1 further comprising at least one drive electrode formed on the substrate to allow electrostatic excitation of the resonator wherein the resonator and the at least one drive electrode define a capacitive transducer gap therebetween.

4. The device as claimed in claim 3 further comprising at least one spacer having a height, each spacer extending between the resonator and the substrate at a nodal point wherein the size of the gap is based on the height of the at least one spacer during pull down of the resonator.

5. The device as claimed in claim 1 wherein the device is a silicon-based resonator device.

6. The device as claimed in claim 1 wherein the device is a diamond-based resonator device.

7. The device as claimed in claim 3 further comprising a sense electrode formed on the substrate to sense output current.

8. A method for extending the operating frequency of a micromechanical resonator device including a resonator having a fundamental resonant mode formed on a substrate and a support structure anchored to the substrate to support the resonator above the substrate, the method comprising:

forcing different portions of the resonator to move in opposite directions at the same time so that the resonator vibrates in a resonant mode, m, higher than the fundamental resonant mode wherein the resonator has m+1 nodal points and wherein the support structure is attached to the nodal points so that the resonator is isolated during resonator vibration.

9. The method as claimed in claim 8 wherein the micromechanical resonator device includes a plurality of drive electrodes spaced along the resonator to allow electrostatic excitation of the resonator and wherein the step of forcing includes the steps of applying an in-phase signal to one of the drive electrodes to deflect a first portion of the resonator in a first direction and applying an out-of-phase signal to the other drive electrode to deflect a second portion of the resonator in a second direction opposite the first direction to force the resonator into a correct mode shape.

10. The method as claimed in claim 8 wherein the support structure includes m+1 beams dimensioned based on the operating frequency and wherein one of the beams is attached at each of the nodal points of the resonator so that the resonator sees substantially no resistance to transverse or torsional motion.

11. The method as claimed in claim 8 wherein the micromechanical resonator device includes a drive electrode formed on the substrate to allow electrostatic excitation of the resonator and wherein the step of forcing includes the step of applying a signal to the drive electrode, the resonator and the drive electrode define a capacitive transducer gap therebetween and wherein the micromechanical resonator further includes m+1 spacers having a height and which extend between the resonator and the substrate at the m+1 nodal points and wherein the m+1 spacers force the resonator into a correct mode shape during the application of the signal to the drive electrode.

12. The method as claimed in claim 11 wherein the micromechanical resonator device includes a sense electrode formed on the substrate to sense output current.

13. The method as claimed in claim 11 wherein the support structure includes less than m+1 beams dimensioned based on the operating frequency of the resonator device and wherein the beams are attached to the nodal points of the resonator so that the resonator sees substantially no resistance to transverse or torsional motion.

14. The method as claimed in claim 8 wherein the support structure includes a single beam.

* * * * *